(12) United States Patent
Blodgett

(10) Patent No.: US 9,355,197 B2
(45) Date of Patent: May 31, 2016

(54) REAL-TIME DEPTH OF FIELD EFFECTS WITHIN DESIGN SOFTWARE

(71) Applicant: DIRTT Environmental Solutions, Ltd., Calgary (CA)

(72) Inventor: Robert W. Blodgett, Salt Lake City, UT (US)

(73) Assignee: DIRTT Environmental Solutions, LTD, Calgary, CA (US)

( * ) Notice: Subject to any disclaimer, the term of this patent is extended or adjusted under 35 U.S.C. 154(b) by 0 days.

(21) Appl. No.: 14/113,260

(22) PCT Filed: Jan. 25, 2013

(86) PCT No.: PCT/US2013/023198
§ 371 (c)(1),
(2) Date: Oct. 22, 2013

(87) PCT Pub. No.: WO2014/116231
PCT Pub. Date: Jul. 31, 2014

(65) Prior Publication Data
US 2015/0317410 A1     Nov. 5, 2015

(51) Int. Cl.
*G06T 15/00* (2011.01)
*G06F 17/50* (2006.01)
(Continued)

(52) U.S. Cl.
CPC ............... *G06F 17/50* (2013.01); *G06T 13/20* (2013.01); *G06T 15/503* (2013.01); *G06T 19/003* (2013.01); *G06T 2210/04* (2013.01)

(58) Field of Classification Search
CPC ....... G06T 19/20; G06T 19/00; G06T 19/003; G06T 2219/2016; G06T 2200/04; G06T 2207/10021
USPC ........................................................ 345/419
See application file for complete search history.

(56) References Cited

U.S. PATENT DOCUMENTS

| | | | |
|---|---|---|---|
| 3,972,163 | A | 8/1976 | Coperthwaite |
| 4,207,714 | A | 6/1980 | Mehls |

(Continued)

FOREIGN PATENT DOCUMENTS

| | | |
|---|---|---|
| JP | 02039377 | 2/1990 |
| JP | 2000132706 | 5/2000 |

(Continued)

OTHER PUBLICATIONS

Ram Schacked et al.: "Automatic Lighting Design Using a Perceptual Quality Metric"; 2001; Eurographic 2011 vol. 20 (2001); p. 1-12.

(Continued)

*Primary Examiner* — Ke Xiao
*Assistant Examiner* — Gordon Liu
(74) *Attorney, Agent, or Firm* — Workman Nydegger

(57) ABSTRACT

Design software can be configured to allow a user in real-time to adjust a depth of field of a perspective of the user within a design space. In one implementation, for example, the design software can receive one or more inputs from a user regarding a layout of one or more objects in a design space. The design software can also render a three-dimensional model of the layout of the design space for display on a computerized display. The software can then receive from the user one or more input selections regarding a desired depth of field of the perspective of the user relative to one of the one or more objects rendered within the three-dimensional model. In addition, the design software can calculate revised rendering instructions that blur at least a portion of the design space. Furthermore, the design software can display, in real-time, the three-dimensional model with the desired depth of field to the user.

20 Claims, 7 Drawing Sheets

(51) Int. Cl.
*G06T 13/20* (2011.01)
*G06T 19/00* (2011.01)
*G06T 15/50* (2011.01)

(56) References Cited

U.S. PATENT DOCUMENTS

| | | | |
|---|---|---|---|
| 4,705,401 A | 11/1987 | Addleman | |
| 5,625,827 A | 4/1997 | Krause | |
| 5,673,374 A | 9/1997 | Sakaibara | |
| 5,801,958 A | 9/1998 | Dangelo | |
| 5,866,419 A | 12/1998 | Lucas | |
| 5,870,771 A | 2/1999 | Oberg | |
| 6,078,332 A | 6/2000 | Ohazama | |
| 6,097,394 A * | 8/2000 | Levoy | G02B 27/2271 345/419 |
| 6,268,863 B1 * | 7/2001 | Rioux | G06T 15/00 345/426 |
| 6,292,810 B1 | 9/2001 | Richards | |
| 6,493,679 B1 | 12/2002 | Rappaport | |
| 6,580,426 B1 | 6/2003 | Small | |
| 6,629,065 B1 | 9/2003 | Gadhi | |
| 6,900,841 B1 * | 5/2005 | Mihara | G06T 5/002 348/222.1 |
| 6,971,063 B1 | 11/2005 | Rappaport | |
| 7,019,753 B2 | 3/2006 | Rappaport | |
| 7,062,454 B1 | 6/2006 | Giannini | |
| 7,085,697 B1 | 8/2006 | Rappaport | |
| 7,096,173 B1 | 8/2006 | Rappaport | |
| 7,099,803 B1 | 8/2006 | Rappoport | |
| 7,155,228 B2 | 12/2006 | Rappaport | |
| 7,171,208 B2 | 1/2007 | Rappaport | |
| 7,216,092 B1 | 5/2007 | Weber | |
| 7,243,054 B2 | 7/2007 | Rappaport | |
| 7,246,045 B1 | 7/2007 | Rappaport | |
| 7,299,168 B2 | 11/2007 | Rappaport | |
| 7,299,416 B2 | 11/2007 | Jaeger | |
| 7,623,137 B1 | 11/2009 | Miller | |
| 7,817,823 B1 | 10/2010 | O'Donnell | |
| 7,825,937 B1 | 11/2010 | Sakhartchouck | |
| 8,255,338 B1 | 8/2012 | Brittan | |
| 8,271,336 B2 | 9/2012 | Mikurak | |
| 8,276,088 B2 | 9/2012 | Ke | |
| 8,285,707 B2 | 10/2012 | Day | |
| 8,290,849 B2 | 10/2012 | Eisler | |
| 8,301,527 B2 | 10/2012 | Tarbox | |
| 8,332,401 B2 | 12/2012 | Hull | |
| 8,332,827 B2 | 12/2012 | Edde | |
| 8,335,789 B2 | 12/2012 | Hull | |
| 8,386,918 B2 | 2/2013 | Do | |
| RE44,054 E | 3/2013 | Kim | |
| 8,402,473 B1 | 3/2013 | Becker | |
| 8,423,391 B2 | 4/2013 | Hessedenz | |
| 8,442,850 B2 | 5/2013 | Schorr | |
| 8,510,382 B2 | 8/2013 | Purdy | |
| 8,521,737 B2 | 8/2013 | Hart | |
| 8,566,419 B2 | 10/2013 | Purdy | |
| 8,600,989 B2 | 12/2013 | Hull | |
| 8,626,877 B2 | 1/2014 | Greene | |
| 8,645,973 B2 | 2/2014 | Bosworth | |
| 8,650,179 B2 | 2/2014 | Driesch | |
| 8,773,433 B1 | 7/2014 | Smyrl | |
| 2004/0027371 A1 | 2/2004 | Jaeger | |
| 2004/0075655 A1 | 4/2004 | Dunnett | |
| 2004/0100465 A1 | 5/2004 | Stowe | |
| 2004/0174358 A1 | 9/2004 | Takagi | |
| 2005/0072059 A1 | 4/2005 | Hodsdon | |
| 2005/0104883 A1 | 5/2005 | Snyder | |
| 2006/0274064 A1 | 12/2006 | Dougherty | |
| 2007/0098290 A1 | 5/2007 | Wells | |
| 2007/0109310 A1 | 5/2007 | Xu | |
| 2007/0276791 A1 | 11/2007 | Fejes | |
| 2009/0187389 A1 | 7/2009 | Dobbins et al. | |
| 2010/0018141 A1 | 1/2010 | Kelly | |
| 2010/0128038 A1 | 5/2010 | Hoffman | |
| 2010/0268513 A1 | 10/2010 | Loberg | |
| 2011/0227922 A1 | 9/2011 | Shim | |
| 2011/0227924 A1 | 9/2011 | Nakajima | |
| 2011/0265405 A1 | 11/2011 | Ksenych | |
| 2012/0288184 A1 | 11/2012 | Zomet | |
| 2014/0095122 A1 * | 4/2014 | Appleman | G06T 19/003 703/1 |

FOREIGN PATENT DOCUMENTS

| | | |
|---|---|---|
| JP | 2007264707 | 10/2007 |
| WO | 02059545 | 8/2002 |
| WO | 2007138560 | 12/2007 |
| WO | 2013040016 | 3/2012 |

OTHER PUBLICATIONS

Ravi Mamoorthi et al., "A First-Order Analysis of Lighting, Shading, and Shadows," ACM Transactions on Graphics, vol. 26, No. 1, Article 2, Jan. 31, 2007. See p. 2, 8, and 12-15.

Erco, "Erco Guide," http://www.erco.com/download/data/30_media/_guide_pdf/120_en/_erco_guide_7_simulation.pdf, May 12, 2006. See p. 376, 389-388, 399, and 427.

Joseph Zupko et al., "System for Automated Interactive Lighting (SAIL)," In: Proceedings for the 4th International Conference on Foundations of Digital Games, 2009, pp. 223-230. See pp. 223-226.

Maxwell Render, "Maxwell Render 2.5 User Manual," http://www.architektur.uni-kl.de/digitalewrkzeuge/ss13/digitalewerkzeuge/maxwel-english.pdf, Dec. 31, 2010. See p. 22-25, 36-37, and 48-49.

Jeremy Birn, "Digital Lighting and Rendering," Pearson Education, 2nd ed., 2006, ISBN 0132798212. See p. 35-59.

Pierre-Felix Breton, "Autodesk Revit and ads Max Design for Lighting and Daylighting simulation," http://www.pfbreton.com/wordpress/wp-content/uploads/2012/05/L12L07%20Handout.pdf, May 7, 2012. See pp. 28, 51-52, and 87-103.

David Cohn, "Photorealistic Rendering Techniques in AutoCAD3D, " Autodesk University 2009, http://www.dscohn.com/AU/handouts/AU214-2%20-%20Photorealistic%20Rendering%20Techniques%20in%20AutoCAD%203D.pdf, Dec. 31, 2009. See pp. 4-6.

International Search Report and Written Opinion for PCT/US2012/068805 mailed Aug. 29, 2013.

International Search Report and Opinion, PCT/US2013/045047, mailed Mar. 3, 2014.

International Search Report and Opinion, PCT/US2013/043735, mailed Feb. 27, 2014.

International Search Report and Opinion, PCT/US2013/050764, mailed Feb. 27, 2014.

CG BLOG; "Photoshop tutorial and post-production glasses"; Retrieved online from; www.grafica3dblog.it/photoshop_tutorial_glass.htm; pp. 1-7.

International Search Report and Written Opinion for PCT/US2013/024009 mailed Oct. 25, 2013.

International Search Report for PCT/US2013/023198 mailed Oct. 18, 2013.

International Search Report and Written Opinion for PCT/US2013/024063 mailed Oct. 25, 2013.

International Search Report and written opinion for PCT/US2013/023198 mailed Oct. 18, 2013.

Final Office Action for U.S. Appl. No. 14/110,910 mailed Feb. 2, 2016.

Final Office Action for U.S. Appl. No. 14/348,879 mailed Feb. 22, 2016.

Non-Final Office Action for U.S. Appl. No. 14/110,910 mailed for Sep. 14, 2015.

Non-Final Office action for U.S. Appl. No. 14/348,879 maield on Sep. 22, 2015.

* cited by examiner

REAL-TIME DEPTH OF FIELD EFFECTS WITHIN DESIGN SOFTWARE

CROSS-REFERENCE TO RELATED APPLICATIONS

The present invention is a 35 U.S.C. §371 U.S. National Stage of PCT Application No. PCT/US2013/023198 titled "REAL-TIME DEPTH OF FIELD EFFECTS WITH DESIGN SOFTWARE," filed Jan. 25, 2013, which is incorporated by reference herein.

BACKGROUND OF THE INVENTION

1. The Field of the Invention

The present invention relates generally to computer-aided design or drafting software.

2. The Relevant Technology

Computer systems now play a critical role in building and/or architectural design. In particular, architects and interior designers ("or designers") use a wide range of computer-aided design (CAD) software for designing the aesthetic as well as functional aspects of a given residential or commercial space. For example, a designer might use an architectural design program (e.g., a CAD program) to design the interior layout of an office building. The designer might then render the layout to create a three-dimensional model of the interior of the office building that can be displayed to a client.

Some CAD programs may provide the designer with the ability to navigate throughout the model. For example, the designer may be able to navigate from an office space to an attached lobby within the three-dimensional model. In some cases, the designer may want to show a client the general layout of an architectural design by navigating from room-to-room within the three-dimensional model.

In particular, the designer may desire to make a movie file depicting the designer's movements throughout the three-dimensional model. The movie file could then be sent to the client, allowing the client to see the layout of the architectural design without the client having to render the three-dimensional model within a CAD program. Alternatively, a designer may want to send an interactive flythrough of the layout to the client.

In a flythrough, the client can advance the flythrough from one predetermined perspective to another, while having the ability to stop and navigate the three-dimensional model at any time during the flythrough. This can allow a designer to provide a client with a pathway for viewing a particular three-dimensional model. Unfortunately, certain types of special effects for use in viewing, focusing, or otherwise presenting a movie file or an interactive flythrough tend to be very limited within architectural design programs.

For example, when navigating through the three-dimensional model or when creating a movie file, a designer may want to emphasize certain aspects or features of the design. In particular, a designer may want to create a movie file or interactive flythrough for a client that emphasizes a statue that is depicted within the three-dimensional model. When orchestrating the path of the camera for either the movie file or interactive flythrough, a designer may emphasize the statue by lingering on it for an extended period of time.

Simply, lingering on the statue, however, may not be sufficient to indicate to a client what element is being emphasized. The client may be uncertain whether the statue as a whole is being emphasized, whether a particular portion of the statue is being emphasized, or whether some element in the background of the statue is being emphasized.

Conventional methods of emphasizing a particular element of a scene include changing the depth of field to focus on the emphasized element, while blurring the remainder of the image. This particular effect, based on how real-life photography cameras work, tends to be limited or non-existent in design programs. In particular, although a select few design programs may allow a designer to adjust the depth of field on an image-by-image basis, this feature tends to be nonexistent or extremely limited when rendering interactive flythroughs or movie scenes of the designed environment.

Specifically, conventional design programs tend to be particularly limited where a designer may need to adjust the depth of field in real time while navigating within the three-dimensional model. Accordingly, there are a number of disadvantages in the art that can be addressed.

BRIEF SUMMARY OF THE INVENTION

Implementations of the present invention overcome one or more problems in the art with systems, methods, and apparatus configured to allow a user in real-time to adjust the depth of field of the perspective of the user within a three-dimensional model. In particular, at least one implementation of the present invention allows a user to adjust the depth of field of his or her perspective within the three-dimensional model and continue to navigate the three-dimensional model while maintaining the adjusted depth of field. Additionally, at least one implementation also allows the user to create, in real-time, a movie file or interactive flythrough with a variety of different depths of field throughout a layout, and automatically animates the effect between the different settings and positions in space.

For example, a method in accordance with at least one implementation of allowing a user in real-time to adjust a depth of field of a perspective of the user within a design space can include rendering a three-dimensional model of a layout of the design space within the architectural design environment. The method can also include receiving one or more inputs from a user regarding a layout of one or more objects in a design space. Additionally, the method can include rendering a three-dimensional model of the layout of the design space for display on a computerized display. In addition, the method can include receiving from the user one or more input selections regarding a desired depth of field of the perspective of the user relative to one of the one or more objects rendered within the three-dimensional model. Further, the method can include calculating revised rendering instructions that blur at least a portion of the design space. Further still, the method can include displaying, in real-time, the three-dimensional model with the desired depth of field to the user.

In an additional or alternative implementation, a method for allowing a user in real-time to create a movie file or an interactive flythrough of one or more scenes while adjusting the depth of field of the one or more scenes can include receiving from the user one or more inputs regarding a layout of the design space within the architectural design environment. The method can also include rendering a three-dimensional model of the layout of the design space within the architectural design environment. In addition, the method can include creating the movie file or the interactive flythrough in real-time showing various aspects of the three-dimensional model. Furthermore, the method can include receiving from the user one or more inputs regarding adjustments to the depth of field of the one or more scenes from the perspective of the user within the three-dimensional model. Still further, the method can include capturing within the movie file or interactive flythrough in real-time the adjustments to the depth of field of the one or more scenes.

These and other objects and features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. It should be noted that the figures are not drawn to scale, and that elements of similar structure or function are generally represented by like reference numerals for illustrative purposes throughout the figures. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
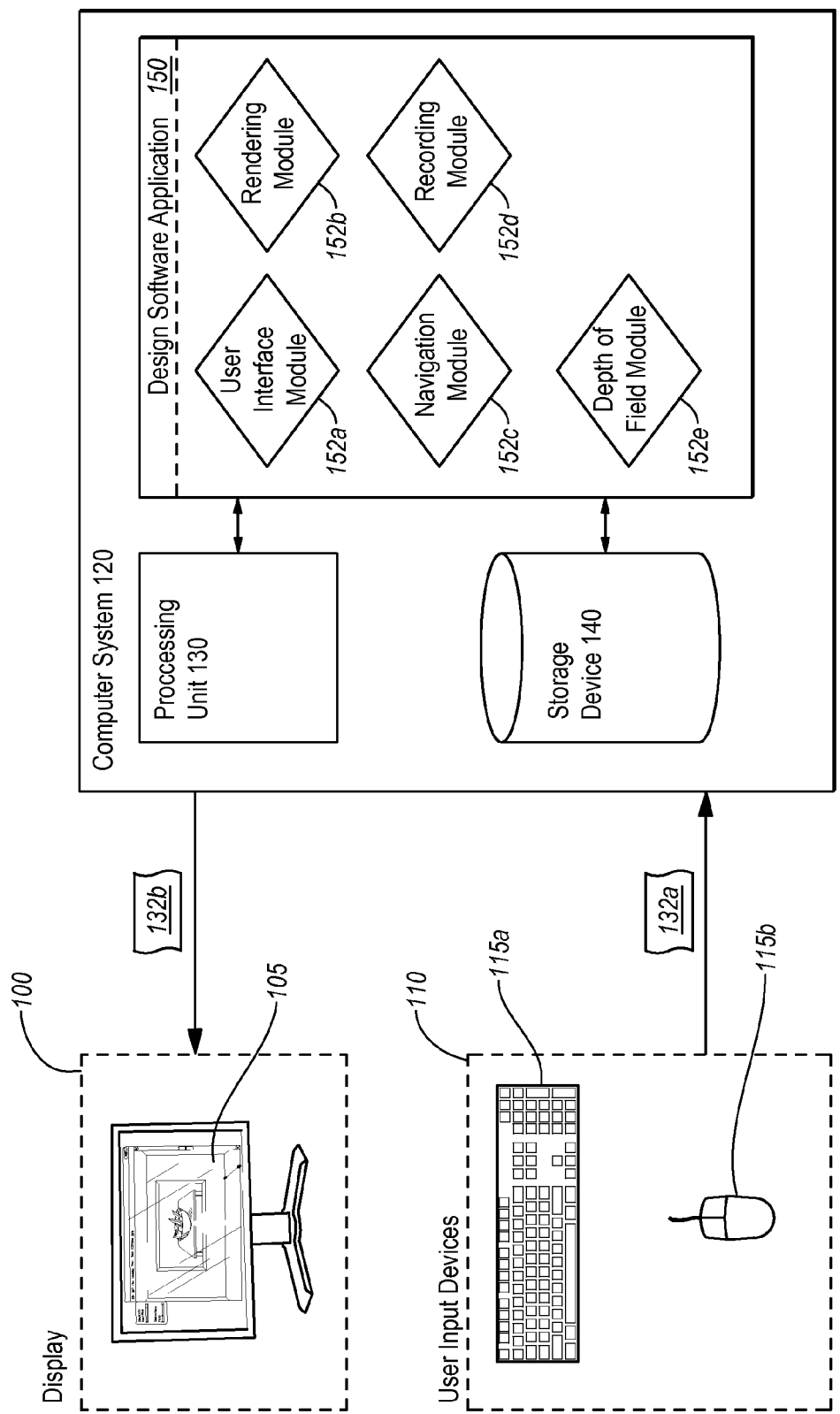
FIG. 1 illustrates an architectural schematic diagram of a system for adjusting the depth of field of a user's perspective of a three-dimensional model in accordance with an implementation of the present invention.

Implementations of the present invention extend to systems, methods, and apparatus configured to allow a user in real-time to adjust the depth of field of the perspective of the user within a three-dimensional model. In particular, at least one implementation of the present invention allows a user to adjust the depth of field of his or her perspective within the three-dimensional model and continue to navigate the three-dimensional model while maintaining the adjusted depth of field. Additionally, at least one implementation also allows the user to create, in real-time, a movie file or interactive flythrough with a variety of different depths of field throughout a layout, and automatically animates the effect between the different settings and positions in space. At least one implementation of the invention allows a user to playback and view the depth of field effect animating between two or more views.

For example, at least one implementation relates to displaying, in real-time, three-dimensional models with a specific depth of field. In at least one implementation, the depth of field can be adjusted interactively resulting in the three-dimensional model being displayed, in real-time, with the adjusted depth of field. The system, software, and methods of the present invention can receive from a user input regarding a desired depth of field with respect to a displayed three-dimensional model.

Additionally, in at least one implementation, a user can navigate within the three-dimensional model. For example, a user can navigate from an office into a lobby within the three-dimensional model. While navigating within the three-dimensional model, a user can adjust the depth of field of the user's view of a scene within the three-dimensional model. Further, in at least one implementation, the user can navigate to another part of the three-dimensional model while maintaining the previously adjusted depth of field. In at least one implementation, the depth of field of a displayed scene can be adjusted in real-time while a user is navigating within the three-dimensional model.

In addition, in at least one implementation, a user can create a movie file depicting various views within the three-dimensional model. For example, a user can create a movie file depicting various elements of an office space within a three-dimensional model. Specifically, a user can create a movie depicting the layout and design of furniture within the office space. Additionally, a user can adjust the depth of field of various scenes in the movie in real-time while they are being recorded. For example, while creating the movie file or interactive flythrough, a user can adjust the depth of field at a first location and time frame to focus on a piece of furniture within the office space, and then adjust the depth of field at a second time frame and/or location to focus on a painting hanging on a wall of the office space.

In addition, at least one implementation allows a user to create bookmarks within the three-dimensional model. Bookmarks can be used to designate specific locations and perspectives within a three-dimensional model that a user marks for later display. The bookmarks can be ordered together to form a path from one view to the next. For instance, the bookmarks can designate specific locations and perspectives that can later be incorporated into a movie file or interactive flythrough. Additionally, the bookmarks can include duration information that indicates the amount of time that a movie file or interactive flythrough should spend at a particular location and perspective. Furthermore, in a least one implementation the bookmarks can include depth of field information, such that the depth of field at that particular bookmark is customized by the user. Within at least one implementation, when creating a movie or interactive flythrough using the bookmarks, the system can automatically adjust the depth of field based upon the bookmark that corresponds with the recorded scene.

Accordingly, one will appreciate in view of the specification and claims herein that at least one implementation of the present invention allows a user in real-time to adjust a depth of field of a perspective of the user within a design space. Specifically, at least one implementation of the present invention allows a user to create a movie file or interactive flythrough depicting various portions of the three-dimensional model with the adjusted depths of field. One will appreciate that at least one implementation further allows the user to navigate about the three-dimensional model while maintaining a specific depth of field that was chosen by the user.

Along these lines, FIG. 1 depicts an architectural schematic diagram of a computer system 120 for adjusting the depth of field of a user's perspective of a three-dimensional model in accordance with an implementation of the present invention. In particular, FIG. 1 shows user input devices 110 that communicate with the computer system 120, which in turn communicates with a display 100. FIG. 1 shows that the user input devices 110 can include any number of input devices or mechanisms, including but not limited to a mouse 115b, a keyboard 115a, or other forms of user input devices. Of course, one will appreciate that input devices or mechanisms in accordance with implementations of the invention can further include touch screens, voice input, and other forms of inputs.

In addition, FIG. 1 shows that computer system 120 comprises a design software application 150 executed by a processing unit 130. One will appreciate that the processing unit 130 can comprise a central processing unit, a graphics processor, a physics processor, or any other type of processing unit. FIG. 1 further shows that the computer system 120 can comprise a storage device 140. In at least one implementation, storage device 140 can contain, among other things, templates and objects that can be placed within a three-dimensional model 105. These components, in conjunction with processing unit 130, store and execute the instructions of design software application 150.

FIG. 1 further shows that a user in this case uses the input device(s) 110 to send requests (e.g., 132a) to the computer system 120. In one implementation, the processing unit 130 implements and/or executes the request from user input devices 110, and application 150 instructions. For example, a user can make requests 132a relating to the design and rendering of a three-dimensional model 105 within a design software application 150, as executed by processing unit 130. FIG. 1 further shows that the design software application 150 can then pass the requests 132a to the appropriate modules within the design software application 140.

Ultimately, design application 150 sends rendering instructions through rendering module 152b to display 100. As shown in FIG. 1, for example, display 100 displays a graphical user interface in which the user is able to interact (e.g., using the user input devices 110, or by touching the display 100 directly in the case of a touch screen device). In particular, FIG. 1 shows that the graphical user interface can include a depiction of a three-dimensional model 105 of a design space comprising in this case a room containing an out-of-focus vase and pedestal and a picture on a wall.

One will appreciate in view of the specification and claims herein that the user interface module 152a can provide to the user an option to make design changes to the three-dimensional model 105. In at least one implementation, the user interface module 152a can provide to the user an option to navigate within the three-dimensional model 105. Upon receiving such a request, the user interface module 152a can communicate the request to the navigation module 152c. The navigation module 152c can provide a user with the ability to travel from a first location within the three-dimensional model 105 to a second location within the three-dimensional model. The navigation module 152c can also provide a user with the ability to change a perspective of the user within the three-dimensional model, or to in some other way adjust the scene that is depicted to the user on the display 100.

The navigation module 150c can also be in communication with the rendering module 152b. As the user navigates within the three-dimensional model 105 the rendering module 150b can render the three-dimensional scene 105 that is displayed to a user on the display 100. Additionally, the rendering module 152b can access the storage device 140. For example, the storage device 140 may contain pre-rendered scene elements, pre-calculated rendering information, or other information meant to increase the rendering speed. Further, in at least one implementation, as a user navigates within the three-dimensional model 105, the rendering module 152b can render in real-time the scene that is displayed to the user.

In at least one implementation, the user interface module 152a can communicate with the recording module 152d. For example, a user can select a recording option provided within the design software application 150. The user's selection can then be sent from the user interface module 152a to the recording module 152d. In at least one implementation, the recording module 152d allows a user to create a movie file comprising live motion perspectives of various aspects of the three-dimensional model 105.

After the recording module 152d receives a request to create a movie file, a user can navigate within the three-dimensional model 105, while the recording module 152 creates a movie file comprising the user's perspective as the user navigates within the three-dimensional model 105. For example, as a user navigates from a hallway into an office, within the three-dimensional model 105, the recording module 152d can create a movie file that depicts the user's perspective moving from the hallway into the office. Furthermore, in at least one implementation the recording module 152d can record multiple instances of a user's movement within the three-dimensional model 105. For example, a user can record the user's perspective through a first part of the three-dimensional model 105, and then can also record, within the same movie file, the user's perspective through a second part of the three-dimensional model 105.

Similarly, in at least one implementation, a user can create a movie file based upon bookmarks that the user has created within the three-dimensional model 105. For example, a user can create a bookmark at a specific location within the three-dimensional model 105. The bookmark can comprise at least one or more of the following: a specific perspective, a specific time period to remain at that location, or a depth of field to implement at that location. In at least one implementation, the recording module 152d can travel between one or more bookmarks as if a user was navigating between the bookmarked locations within the three-dimensional model. In contrast, in at least one implementation, the recording module 152d can abruptly cut from one bookmarked position to another.

Additionally, in at least one implementation, the user interface module 152a can communicate with the depth of field module 152e. The depth of field module 152e can adjust the depth of field of a user's perspective of the three-dimensional model 105. For example, the user interface module 152a can provide to a user tools for adjusting the depth of field of the user's perspective. A user, through the user input devices 110, can send an indication of an adjustment to the depth of field module 152e. The processing unit 105 can receive the indication from the user and send the indication on to the user interface module 152a. The user interface module 152a can then communicate the indication to the depth of field module 152e.

In at least one implementation, the depth of field module 152e can communicate with the rendering module 152b. For example, the depth of field module 152e can calculate the effect that the adjusted depth of field will have on the user's perspective. The depth of field module 152e can then send the calculations to the rendering module 152b, which can in turn render the scene with the adjusted depth of field. The rendering module 152b can then send the rendered scene to the user interface module 152a to be sent to the display 100.

In at least one implementation, the rendering module 152b can communicate with the depth of field module 152e, such that the rendering module can communicate rendered scene information to the depth of field module 152e. The depth of field module 152e can determine the depth of field changes that need to be made to the rendered scene. The depth of field module 152e can then communicate those changes with the rendered scene to the user interface module 152a to be displayed to the user.

Figure 2A:
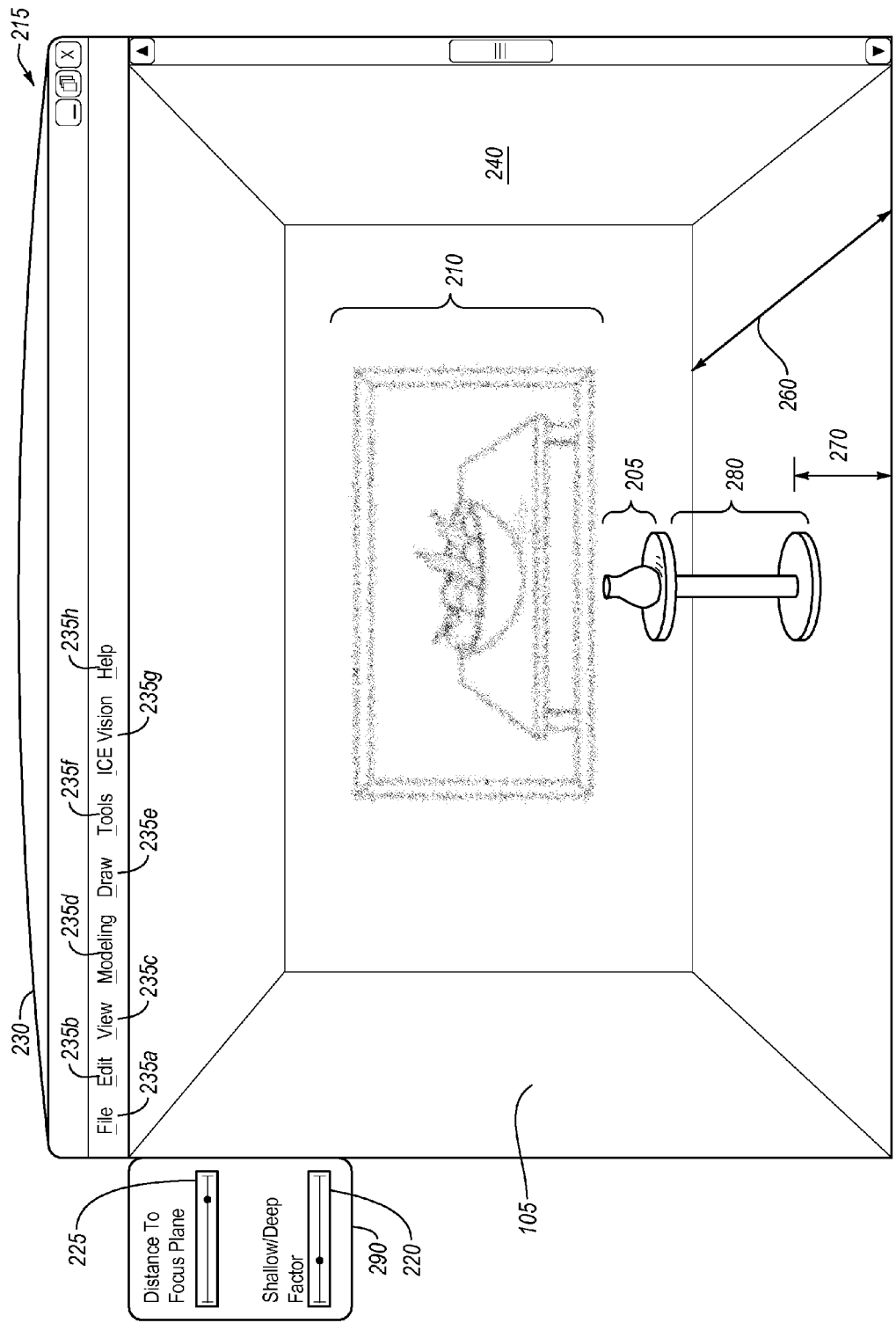
FIG. 2A illustrates a computer display showing a design space with a specific depth of field.

For example, FIG. 2A illustrates a computer display showing a design space 215 depicting a three-dimensional model 105 with a specific depth of field. As an aid to the user, FIG. 2 further shows that the design space 215 comprises a menu bar 230. The menu bar 230 can provide a user various menu options and commands for use within the design space 215. As depicted by the implementation illustrated in FIG. 2, for example, the menu bar 230 can contain any number of user-selected options, including but not limited to a File Menu 235a, an Edit Menu 235b, a Modeling Menu 235c, a Draw Menu 235e, a Tools Menu 235f, and ICE Vision Menu 235g, and a Help Menu 235h. One will understand that the depicted menu options are provided for illustrative purposes only, and that a lesser or a greater amount of menus options can be provided in various implementations.

In at least one implementation, the menu bar 230 provides a user with tools for creating, interacting with, and manipulating the three-dimensional model. For example, FIG. 2A shows that a user has either created or accessed a file containing a three-dimensional model 105. As depicted in FIG. 2A, the three-dimensional model comprises a room 240, which contains a pedestal 280, a vase 205, and a picture 210. The pedestal 280 and vase 205 are a distance 270 away from the user's perspective, while the picture 210 is a distance 260 away from the user's perspective. In at least one implementation, the room 240 is part of a larger three-dimensional model 105. For example, the room 240 of FIG. 2A may be part of a three-dimensional model 105 of a house.

FIG. 2A further shows in this case that the picture 210 is out-of-focus compared to the vase 205 and pedestal 280. In at least one implementation, the difference in clarity between the picture 210 and the vase 204 and pedestal 280 is due to an adjusted depth of field. For example, FIG. 2A shows that design space 215 provides a depth of field control panel 290. In at least one implementation, a user can adjust the depth of field by moving the Distance-To-The-Focus-Plane slider 225 and the Depth Factor slider (i.e., Shallow/Deep-Factor slider) 220. One will understand that the Distance-To-The-Focus-Plane slider 225 and the Shallow/Deep-Factor slider 220 could both be implemented with interfaces other than sliders.

Further, in at least one implementation, the Distance-To-The-Focus-Plane slider 225 can determine the placement of the focus plane within the three-dimensional model 105. For example, adjusting the Distance-To-The-Focus-Plane slider 225 can cause the location of the focus plane to move closer to or further away from the perspective of the user. As used within this application, the focus plane corresponds to an area around a plane within the three-dimensional model 105 that is depicted to the user as being in focus.

Similarly, in at least one implementation, the Shallow/Deep-Factor slider 220 can adjust a depth factor, or, in other words, the rate at which the three-dimensional model becomes out-of-focus as the image moves away from the focus plane. With an extremely shallow depth of field, only the portions of the image directly within the focus plane would appear in focus. For example, with an extremely shallow depth of field, only a portion of the vase 205 may appear clear with the remainder of the vase appearing out-of-focus. In contrast, with an extremely deep depth of field, all, or nearly all, of the entire image would appear clear.

One will understand that in at least one implementation additional inputs can be used to calculate a depth of field effect. For example, inputs relating to the subject matter, a virtual lens focal length, a selected virtual lens f-number, format size, and circle of confusion criterion, among other inputs, may all be used to influence the depth of field. Additionally, in at least one implementation, a plurality of these inputs can be hidden from the user, such that the depth of field module 152e automatically determines the input values.

As depicted within FIG. 2A, the pedestal 280 and vase 205 are within, or near to the focus plane. In contrast, the picture 210 is outside the focus plane (it is farther away). As shown, the focus plane encompasses a distance 270 from the user's perspective, while the distance 260 is outside the focus plane. In at least one implementation, the Shallow/Deep-Factor slider 220 can be adjusted to increase or decrease the blurriness of the picture 210, without adjusting the Distance-To-The-Focus-Plane slider 225. For example, in at least one implementation, if the focus plane of FIG. 2 was not adjusted and the Shallow/Deep-Factor slider 220 was adjusted to make the depth of the field extremely deep then the picture 210, the vase 205, and the pedestal 280 would all appear to be in focus. Similarly, in at least one implementation, if a user adjusts the distance to the focus plane to be distance 260 from the user's perspective, instead of distance 270, then the picture 210 would be in focus, while the vase 205 and pedestal 280 would appear blurry.

Figure 2B:
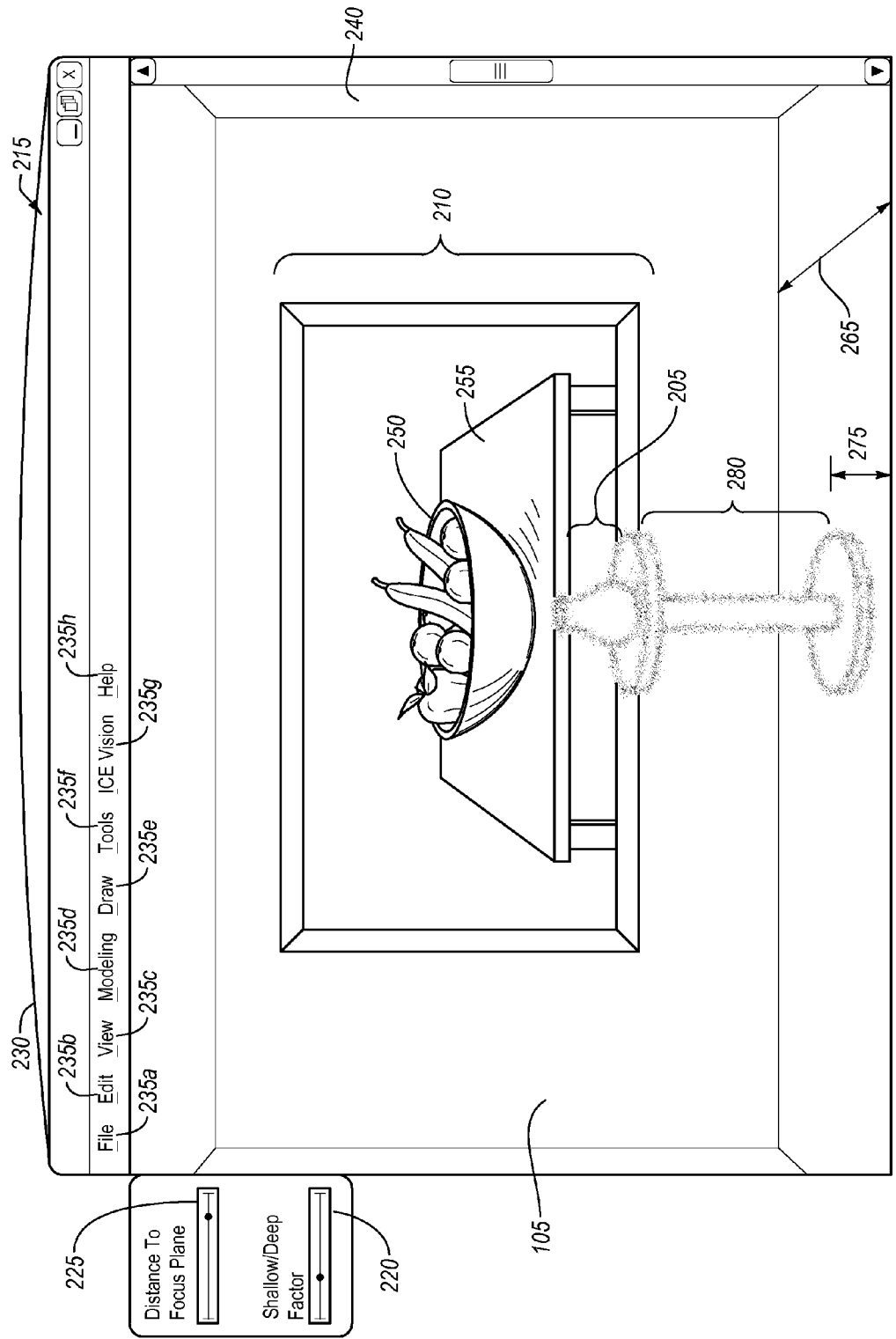
FIG. 2B illustrates a computer display showing a different perspective of the design space from FIG. 2A with a specific depth of field.

In at least one implementation, once a user has adjusted the depth of field, the user can navigate within the three-dimensional model while maintaining the adjusted depth of field. For example, FIG. 2B illustrates a computer display showing the room 240 of FIG. 2A from a different perspective. The perspective of FIG. 2B is closer to the picture 210, the vase 205, and the pedestal 280 than the perspective of FIG. 2A. Additionally, in FIG. 2B the Distance-To-The-Focus-Plane slider 225 and the Shallow/Deep-Factor slider 220 are both at the same setting as in FIG. 2A.

In FIG. 2B, the user's perspective in now a distance 275 away from the vase 205 and the pedestal 280, and the user perspective is distance 265 away from the picture 210. Because the user's perspective within FIG. 2B has moved forward with respect to FIG. 2A, the focus plane has also moved forward, maintaining the same relative distance from the viewer. For example, in FIG. 2B the vase 205 and the pedestal 280 appear to be out-of-focus because they are no longer within the focus plane. In contrast, the picture 210 now appears to be in focus because it now falls within the focus plane, such that the picture now clearly depicts a fruit bowl 250 resting upon a table 255. In other words, in FIG. 2B the focus plane comprises at least the area that is a distance 265 away from the user's perspective.

Figure 3A:
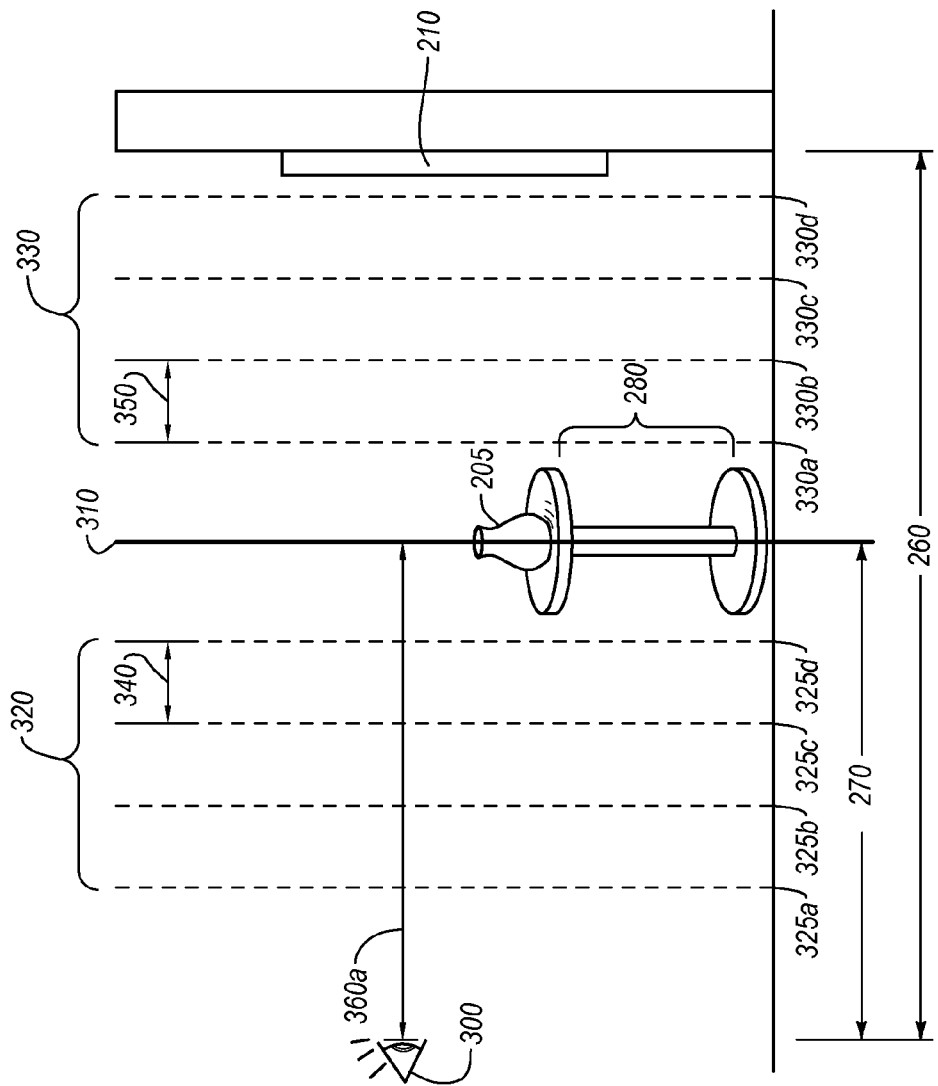
FIG. 3A illustrates a vase within depth of field lines.

FIG. 3A depicts the vase 205, the pedestal 280, and picture 210 from FIG. 2A and FIG. 2B in relation to a focus plane 310 and blur planes 325a, 325b, 325c, 325d, 330a, 330b, 330c, 330d. In this particular case, the user's perspective 300 of FIG. 3A is equivalent to the user's perspective from FIG. 2A. For instance, like in FIG. 2A, the user perspective 300 is distance 270 from the vase 205 and the pedestal 280. Similarly, like in FIG. 2A, the user perspective 300 is distance 260 from the picture 210. Additionally, similar to FIG. 2A, the focus plane 310 is positioned near vase 205 and pedestal 280.

One will understand that the focus plane 310 and blur planes 325a, 325b, 325c, 325d, 330a, 330b, 330c, 330d may not be explicitly depicted on the display 100 to a user, but are depicted in FIG. 3A for the sake of demonstration. In the implementation depicted in FIG. 3A, the focus plane 310 is depicted as being a straight one-dimensional line for the sake of clarity. In at least one implementation, however, the focus plane may comprise a three-dimensional volume that is centered around an axis or a point, such that objects that are contained within the volume appear to be in focus.

FIG. 3A depicts an implementation with eight different blur planes 325a, 325b, 325c, 325d, 330a, 330b, 330c, 330d. One will understand that either fewer or more blur planes can be used within the teachings of this disclosure. In any event, the blur planes are divided into two groups: a front group of blur planes 320 and a back group of blur planes 330. The focus plane 310 and the blur planes 325a, 325b, 325c, 325d, 330a, 330b, 330c, 330d can be used by the depth of field module 152e to calculate the depth of field. Specifically, when a user adjusts the Distance-To-The-Focus-Plane slider 225 and the Shallow/Deep-Factor slider 220 the position of the focus plane 310 and the blur planes 325a, 325b, 325c, 325d, 330a, 330b, 330c, 330d can also change.

Additionally, in at least one implementation, each blur plane 325a, 325b, 325c, 325d, 330a, 330b, 330c, 330d represents a discrete level of blurriness. The blurriness of the individual blur planes 325a, 325b, 325c, 325d within the front group of blur planes 320 can correspond to the blurriness of the individual blur planes 330a, 330b, 330c, 330d within the back group of blur planes 330. For example, the blurriness of blur plane 325a can be equivalent to the blurriness of blur plane 330d. Similarly, the blurriness of blur plane 325d can be equivalent to the blurriness of blur plane 330a.

In addition, the blur planes 330a and 325d that are closest to the focus plane 310 can be the least blurry. In contrast the blur planes 325a and 330d that are furthest from the focus plane 310 can be the most blurry. Similarly, the blur planes 325c and 330b can be more blurry than blur planes 330a and 325d, and blur planes 325b and 330c can be more blurry still. In at least one implementation, the respective blurriness of each blur plane 325a, 325b, 325c, 325d, 330a, 330b, 330c, 330d remains the same without regard to the blur plane's distance from the focus plane 310. In other words, the respective level of blurriness of each blur plane 325a, 325b, 325c, 325d, 330a, 330b, 330c, 330d can remain the same whether the respective blur plane is positioned close to the focus plane 310 or far from it.

In at least one implementation, as a user adjusts the Distance-To-The-Focus-Plane slider 225 the location of the focus plane 310 within the three-dimensional model 105 will move. For example, as a user moves the Distance-To-The-Focus-Plane slider 225 in a first direction the focus plane 310 can move in front of the vase 205 and pedestal 280, such that the vase 205 and pedestal 280 will fall within the back group of blur planes 330. Similarly, as a user moves the Distance-To-The-Focus-Plane slider 225 in a second direction, the focus plane 310 can move behind the vase 205 and pedestal 280, such that the vase 205 and pedestal 280 will fall within the front group of blur planes 320.

Additionally, in at least one implementation, as a user adjusts the Shallow/Deep-Factor slider 220, the distance 340, 350 between the blur planes 325a, 325b, 325c, 325d, 330a, 330b, 330c, 330d can increase or decrease. For example, as a user moves the Shallow/Deep-Factor slider 220 in a first direction, the distance 340, 350 between the blur planes can increase. Similarly, as a user moves the Shallow/Deep-Factor slider 220 in a second direction, the distance 340, 350 between the focus planes can decrease.

In at least one implementation, the distance between each blur plane and its respective neighbors is the same such that the blur planes 325a, 325b, 325c, 325d, 330a, 330b, 330c, 330d are evenly spaced. In contrast, in at least one implementation, the blur planes 325a, 325b, 325c, 325d, 330a, 330b, 330c, 330d are not evenly spaced. For instance, the spacing of the blur planes can be exponential or another nonlinear function, such that the distal planes 330d and 325a are significantly farther away from their neighboring blur planes than the medial blur planes 325d and 330a are from their neighbors.

As depicted by FIG. 3A, the Distance-To-The-Focus-Plane slider 225 has placed the focus plane at distance 360a from the user perspective, which places the focus plane directly over the vase 205 and the pedestal 280. The depth of field module 152e can calculate the vase 205 and pedestal 280 as being completely in focus because they both are directly within the focus plane 310. With respect to the picture 210, however, the depth of field module 152e can calculate the picture as being blurry because it is positioned behind the back group of blur planes 330. Additionally, in at least one implementation the depth of field module 152e would calculate the highest level of blurriness for the picture 210 because the picture is nearest to the blur plane 330d, which represents the highest discrete level of blurriness.

Figure 3B:
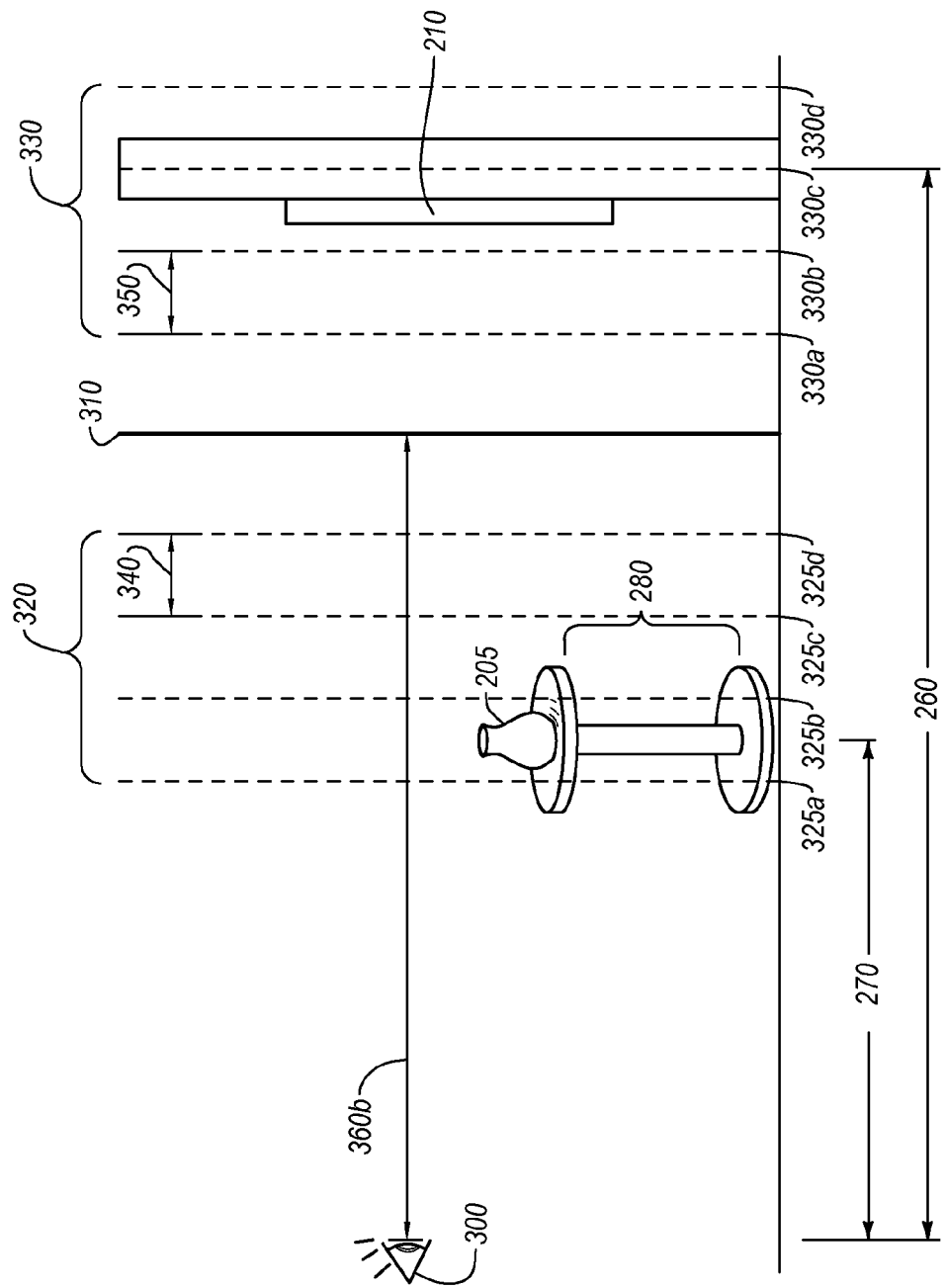
FIG. 3B illustrates the vase of FIG. 3A with depth of field lines.

Similar to FIG. 3A, FIG. 3B depicts the same scene as FIG. 3A, but in FIG. 3B the user has adjusted the Distance-To-The-Focus-Plane slider 225, such that the focus plane 310 is distance 360b away from the user's perspective 300. Thus, as shown, the vase 205 and pedestal 280 now fall between blur planes 325a and 325b. The depth of field module 152e can calculate the blurriness of the vase 205 and pedestal 280 by interpolating between the discrete blurriness of blur plane 325b and the discrete blurriness of blur plane 325a. Similarly, when calculating the blurriness of the picture 210 in FIG. 3B the depth of field module 152e can interpolate between the discrete blurriness of blur plane 330b and the discrete blurriness of blur plane 330b.

When interpolating the blurriness of the picture 210, the depth of field module 152e can weight the discrete blurriness of blur plane 330b more heavily than the discrete blurriness of 330c because the picture is closer to blur plane 330b. Additionally, as illustrated in FIG. 3B, the depth of field module 152e can calculate a lower level of blurriness for picture 210 than for the vase 205 and pedestal 280. This is at least in part because the vase 205 and pedestal 280 are positioned between blur plane 325a and 325b, which have higher discrete levels of blurriness than blur planes 330b and 330c, between which the picture 210 is positioned.

In addition, in at least one implementation a user can adjust the depth of field by adjusting the Shallow/Deep-Factor slider 220. Adjustments to the Shallow/Deep-Factor slider 220 can cause the distance 340, 350 between the blur planes to expand or contract. As the blur planes 325a, 325b, 325c, 325d, 330a, 330b, 330c, 330d contract and get closer to each other and more tightly grouped around the focus plane 310, the depth of field module 152e can calculate that the scene blurs faster as the scene moves away from the focus plane 310. In contrast, as the blur planes 325a, 325b, 325c, 325d, 330a, 330b, 330c, 330d expand and get positioned farther from each other and respectively farther from the focus plane 310, the depth of field module 152e can calculate that the scene blurs more slowly as the scene move away from the focus plane 310. In at least one implementation, the Shallow/Deep-Factor slider 220 can expand the blur planes so much that the entire scene appears to be in focus.

In at least one implementation, the depth of field module 152e calculates the blurriness of various aspects of the scene by using a depth buffer, and by sampling varying amounts of pixels to blur a particular object. In at least one implementation, a depth buffer can be provided to the depth of field module 152e by a graphics processor. One will understand that when creating a blur effect, the greater the number of pixels sampled and included within the blurring effect, the greater the level of blurriness. In contrast, if very few pixels are sampled, then the blurring effect can be minor or even visually non-existent.

In at least one implementation, each respective blur plane 325a, 325b, 325c, 325d, 330a, 330b, 330c, 330d can represent to the depth of field module 152e a number of pixels to sample when creating a blurring effect. For example, because blur planes 325a and 330d represent the highest relative level of blurriness, both of these blur planes can direct the depth of field module 152e to sample the highest relative number of pixels when determining the level of blurriness to associate with a particular object. In contrast, because blur planes 325d and 330a represent the lowest relative level of blurriness, both of these planes can direct the depth of field module 152e to sample the lowest relative number of pixels.

For example, as depicted in FIG. 3B the depth of field module 152e can calculate the blurriness of a particular portion of the vase 205 by accessing the depth buffer to determine the distance between the portion of the vase 205 and of blur plane 325a, and of blur plane 325b, respectively. When determining the level of blurriness that should be associated with the portion of the vase 205, the depth of field module 152e can interpolate the level of blurriness based upon the number of pixel samples associated with blur plans 325a and 325b, respectively, and the distance between the portion of the vase 205 and each respective blur plane.

For instance, if the depth of field module 152e determines, using the depth buffer, that the portion of the vase 205 is equidistant between blur plane 325b and blur plane 325a then the depth of field module 152e can sample a number of pixels that is medial to the number of pixels dictated by blur plane 325a and the number of pixels dictated by blur plane 325b. Similarly, if the depth of field buffer 152e determines that the portion of the vase 205 is closer to blur plane 325b, then the depth of field buffer 152e can sample a number of pixels that is proportionally closer to the number dictated by blur plane 325b. By sampling the determined number of pixels in the area surrounding the portion of the vase 205, the depth of field module 152e can calculate a level of blurriness that corresponds with the position of the Shallow/Deep-Factor slider 220 and the Distance-To-The-Focus-Plane slider 225.

An additional factor that can affect the amount of blurriness is the distance of the sample pixels to the center (in focus) pixel. Sampling pixels that are farther away from the center (in focus) pixel can increase the blurriness in the final result. In at least one implementation, when calculating the level of blurriness, this distance is also interpolated between blur planes. Blur planes closer to the focal plane have smaller sample distances than blur planes which are farther away from the focal plane.

As discussed throughout this specification, at least one implementation allows a user to emphasize a specific aspect of a three-dimensional model 105 by customizing the depth of field. For example, as shown in FIG. 2A and FIG. 3A, a user can emphasize the vase 205 and pedestal 280 by adjusting the Distance-To-The-Focus-Plane slider 225, such that the focus plane 310 is located around the vase 205 and pedestal 280. Additionally, the user can adjust the Shallow/Deep-Factor slider 220 to further focus on a particular portion of the vase 205 and pedestal 280, or to further blur background elements.

Accordingly, FIGS. 1-3B and the corresponding text illustrate or otherwise describe one or more components, modules, and/or mechanisms for efficiently calculating and rendering the depth of field effects in real-time. One will appreciate that implementations of the present invention can also be described in terms of flowcharts comprising one or more acts for accomplishing a particular result. For example, FIGS. 4 and 5 and the corresponding text described acts in a method for adjusting the depth of field with a three-dimensional model. The acts of FIGS. 4 and 5 are described below with respect to the components and modules of FIGS. 1-3B.

Figure 4:
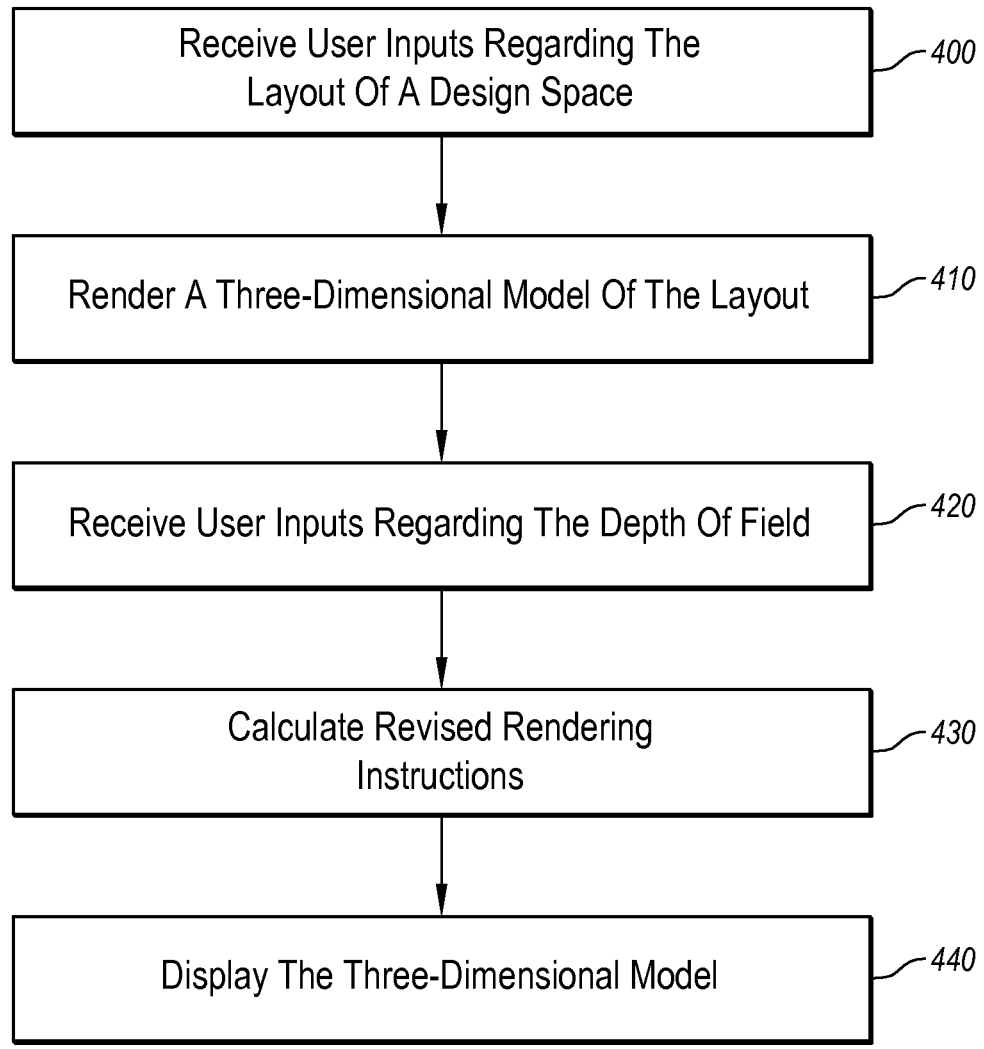
FIG. 4 illustrates a flowchart of a series of acts in a method in accordance with an implementation of the present invention for creating a movie while allowing a user to adjust the depth of field of the user's perspective of a three-dimensional model.
Figure 5:
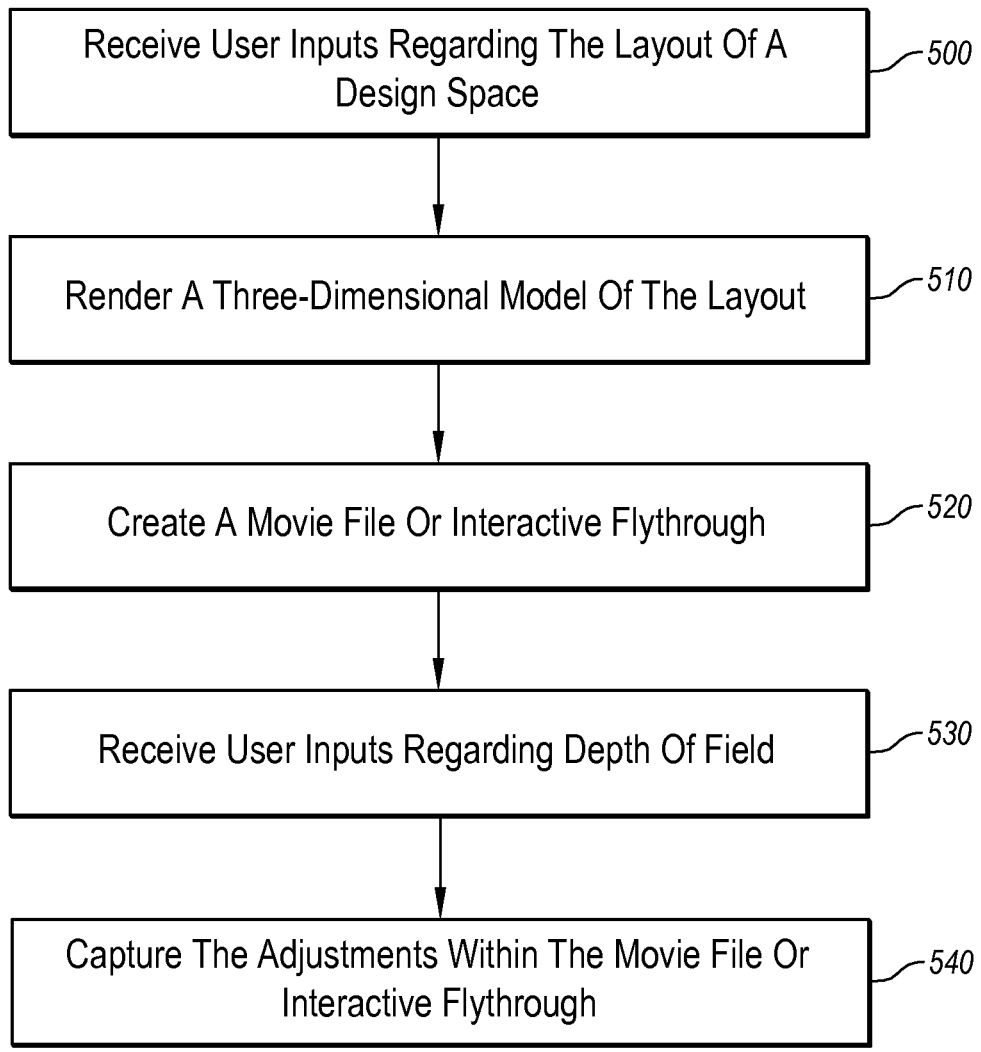
FIG. 5 illustrates a flowchart of a series of acts in a method in accordance with an implementation of the present invention for adjusting the depth of field of a user's perspective of a three-dimensional model.

For example, FIG. 4 illustrates that a method in accordance with an implementation of the present invention for creating a movie or interactive flythrough while allowing a user to adjust the depth of field of the user's perspective of a three-dimensional model can comprise an act 400 of receiving user inputs regarding the layout of a design space. Act 400 can include receiving from a user one or more inputs regarding a layout of the design space within the architectural design environment. For example, FIGS. 1 and 2A show that a design software application 150 can receive inputs regarding the location of a vase 205 and pedestal 280 within the design space.

FIG. 4 also shows that the method can comprise an act 410 of rendering a three-dimensional model of the layout. Act 410 can include rendering a three-dimensional model of the layout of the design space within the architectural design environment. For example, FIG. 2A shows the rendering of a vase 205 and pedestal 280 within a three-dimensional model 105.

In addition, FIG. 4 shows that the method can comprise act 420 of receiving user inputs regarding the depth of field. Act 420 can include receiving from the user one or more input selections regarding a desired depth of field of the perspective of the user relative to one of the one or more objects rendered within the three-dimensional model. For example FIG. 2A shows that a user can send input regarding the depth of field by adjusting the Distance to the Focus Plane and the Shallow/Deep Factor.

Furthermore, FIG. 4 shows that the method can comprise act 430 of calculating revised rendering instructions. Act 430 can include calculating revised rendering instructions that blur at least a portion of the design space. For example, FIG. 2A and FIG. 2B show that a different portions of the design space that have been blurred.

Still further, FIG. 4 shows that the method can comprise an act 440 of displaying a three-dimensional model. Act 440 can include displaying, in real-time, the three-dimensional model with the desired depth of field to the user. For example, FIG. 2A and FIG. 2B depict aspects of the present invention displaying three-dimensional model.

FIG. 5 shows that an additional or alternative method in accordance with an implementation of the present invention for adjusting the depth of field of a user's perspective of a three-dimensional model can comprise an act 500 of receiving user inputs regarding the layout of a design space. Act 500 can include receiving from a user one or more inputs regarding a layout of the design space within the architectural design environment. For example, FIGS. 1 and 2A show that a design software application 150 can receive inputs regarding the location of a vase 205 and pedestal 280 within the design space.

FIG. 5 also shows that the method can comprise act 510 of rendering a three-dimensional model of the layout. Act 410 can include rendering a three-dimensional model of the layout of the design space within the architectural design environment. For example, FIG. 2A shows the rendering of a vase 205 and pedestal 280 within a three-dimensional model 105.

Furthermore, FIG. 5 shows that the method can comprise act 520 of creating a movie file or interactive flythrough. Act 520 can include creating a movie file or interactive flythrough in real-time showing various aspects of the three-dimensional model. For example, FIGS. 2A and 2B depicts two different scenes that could be part of a movie file or interactive flythrough.

In addition, FIG. 5 shows that the method can comprise act 530 of receiving user inputs regarding the depth of field. Act 530 can include receiving from the user one or more input selections regarding a desired depth of field of the perspective of the user relative to one of the one or more objects rendered within the three-dimensional model. For example FIG. 2A shows that a user can send input regarding the depth of field by adjusting the Distance to the Focus Plane and the Shallow/Deep Factor.

Further, FIG. 5 shows that the method can comprise act 540 of capturing the adjustments within the movie file or interactive flythrough. Act 540 can include capturing within the movie file or interactive flythrough in real-time the adjustments to the depth of field of one or more scenes. For example, For example, FIGS. 2A and 2B depicts two different scenes that could be part of a movie file or interactive flythrough.

Accordingly, FIGS. 1-5 provide a number of components, schematics, and mechanisms for allowing a user to adjust the depth of field of a particular view within the three-dimensional model. One will appreciate that the concepts described herein can provide a number of advantages related to the design and presentation of three-dimensional models. For example, at least one implementation of the present invention allows a furniture designer to highlight specific pieces of furniture within a design space. Additionally, in at least one implementation the present invention allows a designer, who is creating a movie or interactive flythrough file for a client, to implement realistic photography and videography effects into the presentation output.

The embodiments of the present invention may comprise a special purpose or general-purpose computer including various computer hardware components, as discussed in greater detail below. Embodiments within the scope of the present invention also include computer-readable media for carrying or having computer-executable instructions or data structures stored thereon. Such computer-readable media can be any available media that can be accessed by a general purpose or special purpose computer.

By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

I claim:

1. In a computerized architectural design environment in which a design program is loaded into memory and processed at a central processing unit, a computer-implemented method for allowing a user in real-time to adjust a depth of field of a perspective of the user within a design space, the method comprising:
   receiving one or more inputs from a user regarding a layout of one or more objects in a design space;
   rendering a three-dimensional model of the layout of the design space for display on a computerized display;
   receiving from the user one or more input selections regarding a desired depth of field of the perspective of the user relative to at least one specified object of the one or more objects rendered within the three-dimensional model;
   calculating revised rendering instructions that blur at least a portion of the design space based on the global position of the at least one specified object; and
   displaying, in real-time, the three-dimensional model with the desired depth of field to the user, the global position of the at least one specified object remaining the same, the depth of field being maintained relative to the at least one specified object during navigation of the three-dimensional model.

2. The method as recited in claim 1, further comprising:
   receiving from a user an indication to save information about at least one particular perspective within the three-dimensional model.

3. The method as recited in claim 2, wherein the information about the at least one particular perspective comprises depth of field information.

4. The method as recited in claim 3, wherein the information about the at least one particular perspective comprises durational information that indicates a viewing duration of the particular perspective.

5. The method as recited in claim 4, further comprising:
   creating, in real-time, a movie file or interactive flythrough file based upon at least one bookmark:
   wherein the movie file or interactive flythrough comprises the particular perspective, depth of field, and duration that is associated with the at least one bookmark.

6. The method as recited in claim 1, further comprising receiving from the user input regarding the layout of the design space.

7. The method as recited in claim 1, further comprising:
   creating, in real-time, a movie file or interactive flythrough of the perspective of the user within the three-dimensional model
   wherein the perspective of the user within the three-dimensional model comprises the desired depth of field.

8. The method as recited in claim 1, wherein receiving from the user one or more inputs regarding the desired depth of field comprises receiving from the user an indication of a distance to a focus plane.

9. The method as recited in claim 1, wherein receiving from the user one or more inputs regarding the desired depth of field comprises receiving from the user an indication of a depth factor.

10. The method as recited in claim 1, further comprising allowing the user to interpolate between two or more depth of field settings.

11. The method as recited in claim 1, further comprising displaying in real-time changes, interpolations, or animations of the depth of field effect applied to the three-dimensional model, as the user navigates through the layout or plays back the movie file.

12. In a computerized architectural design environment in which a design program is loaded into memory and processed at a central processing unit, a computer-implemented method for allowing a user in real-time to create a movie file or interactive flythrough of one or more scenes while adjusting a depth of field of the one or more scenes, the method comprising:
   receiving from the user one or more inputs regarding a layout of the design space within the architectural design environment, the design space including one or more objects;
   rendering a three-dimensional model of the layout of the design space within the architectural design environment;
   creating a movie file or interactive flythrough in real-time showing various aspects of the three-dimensional model;
   receiving from the user one or more inputs regarding adjustments to the depth of field for at least one specified object of the one or more objects of the one or more scenes from the perspective of the user within the three-dimensional model; and
   capturing within the movie file or interactive flythrough in real-time the adjustments to the depth of field of one or more scenes, the global position of the at least one specified object remaining the same, the depth of field being maintained relative to the at least one specified object during navigation of the three-dimensional model.

13. The method as recited in claim 12, further comprising:
   creating a bookmark;
   wherein the bookmark comprises information associated with a particular perspective within the three-dimensional model.

14. The method as recited in claim 13, wherein the bookmark further comprises depth of field information associated with the particular perspective within the three-dimensional model.

15. The method as recited in claim 14, wherein the bookmark further comprises durational information, which indicates an amount of time that should be spent viewing the particular perspective, and the amount of time that should be spent flying to the location.

16. The method as recited in claim 15, further comprising:
   creating, in real-time, a movie file or interactive flythrough based upon one or more bookmarks;
   wherein the movie file or interactive flythrough comprises the particular perspective, depth of field, and duration that is associated with the one or more bookmarks.

17. The method as recited in claim 12, wherein receiving from the user the one or more inputs regarding adjustments to the depth of field comprises receiving from the user an indication of a distance to a focus plane.

18. The method as recited in claim 12, wherein receiving from the user the one or more inputs regarding adjustments to the depth of field comprises receiving from the user an indication of a depth factor.

19. The method as recited in claim 12, further comprising:
   calculating at least one blur plane, wherein the blur plane is associated with a pixel sample number and pixel sample distance;
   positioning the at least one blur plane based upon a location of a focus plane and a shallow factor or deep factor;
   determining a blur-plane distance, wherein the blur-plane distance is a measurement between a specific point within the three-dimensional model and the at least one blur plane; and
   calculating the blurriness of the specific point based upon the blur-plane distance, the pixel sample number, and the pixel sample distance.

20. A computer program product for use at a computer system, the computer program product for implementing a method for allowing a user in real-time to adjust a depth of field of a perspective of the user within a design space, the computer program product comprising one or more computer storage media having stored thereon computer-executable instructions that, when executed at a processor, cause the computer system to perform the method, including the following:
   receiving one or more inputs from a user regarding a layout of one or more objects in a design space;
   rendering a three-dimensional model of the layout of the design space for display on a computerized display;
   receiving from the user one or more input selections regarding a desired depth of field of the perspective of the user relative to at least one specified object of the one or more objects rendered within the three-dimensional model;
   calculating revised rendering instructions that blur at least a portion of the design space based on the global position of the at least one specified object; and
   displaying, in real-time, the three-dimensional model with the desired depth of field to the user, the global position of the at least one specified object remaining the same, the depth of field being maintained relative to the at least one specified object during navigation of the three-dimensional model.

* * * * *